United States Patent [19]
Abbas et al.

[11] 3,962,052
[45] June 8, 1976

[54] PROCESS FOR FORMING APERTURES IN SILICON BODIES

[75] Inventors: Shakir A. Abbas, Wappingers Falls; Robert C. Dockerty, Highland; Michael R. Poponiak, Newburgh, all of N.Y.

[73] Assignee: International Business Machines Corporation, Armonk, N.Y.

[22] Filed: Apr. 14, 1975

[21] Appl. No.: 567,656

[52] U.S. Cl. .......................... 204/129.3; 204/129.65
[51] Int. Cl.² ............................................ C25F 3/00
[58] Field of Search ......... 204/129.3, 129.65, 129.1, 204/129.75

[56] References Cited
UNITED STATES PATENTS

| | | | |
|---|---|---|---|
| 3,418,226 | 12/1968 | Marinace | 204/129.65 |
| 3,616,348 | 6/1968 | Greig | 204/129.65 |
| 3,640,806 | 2/1972 | Watanabe et al. | 204/32 S |
| 3,640,807 | 2/1972 | Van Dijk | 204/129.3 |
| 3,648,131 | 3/1972 | Stuby | 317/235 R |
| 3,661,741 | 5/1972 | Meek | 204/129.3 |
| 3,713,922 | 1/1973 | Lepselter et al. | 204/129.3 |

*Primary Examiner*—T. M. Tufariello
*Attorney, Agent, or Firm*—Wolmar J. Stoffel

[57] ABSTRACT

A process for forming holes with precisely controlled dimension and position in monocrystalline silicon wafers wherein the holes are fabricated with vertical sides. In the preferred process, both sides of the silicon body are masked, opposite registered openings made in the masking layers, an impurity introduced through the openings into the body forming low resistivity regions, the body anodically etched through the openings until a porous silicon region is formed completely through the body, and subsequently removing the resultant porous silicon region with a silicon etchant.

16 Claims, 6 Drawing Figures

PROCESS FOR FORMING APERTURES IN SILICON BODIES

DESCRIPTION OF THE PRIOR ART

This invention relates to a process for fabricating semiconductor devices, more particularly, for shaping monocrystalline semiconductor material, still more particularly to forming apertures through a silicon wafer.

The shaping of monocrystalline semiconductor material is normally done in the semiconductor industry by subtractive etching, i.e. by suitably masking the semiconductor wafer with a material that resists the etchant and subsequently exposing the surfaces of the wafer to an etchant for the semiconductor material. However, when forming apertures through a semiconductor wafer, this process produces openings that are conical in shape. The upper portion of the hole is enlarged as the etchant penetrates deeper into the wafer. When the wafer is masked on both sides with registered openings, the completed hole has a necked down central portion. This shape may be less desirable than a hole with vertical sides when filling with conductive material, as for example, when forming through conduits in utilizing both sides of the wafer for devices. Further, the enlarged surface diameter of the hole uses more surface area of the wafer which may also be an important consideration. It is also known to make the semiconductor body the anode in an electrolyte solution and removing material by anodization as shown in IBM, TDB, Vol. 15, No. 2, July 1972, p. 682. Other techniques for shaping semiconductor materials include selective removal of material by a laser beam or E-beam. However, with these techniques, a precise locating of the hole is difficult and the probability of causing damage to the crystalline body is great. Unlike subtractive etching where the hole is produced by photoresist techniques, the locating of the opening must be preceded by a precise location of the beam on the wafer. Yet another technique for shaping semiconductor material is sputter etching. However, the rate of removal of the silicon is low and in general the process is impractical for forming openings completely through a wafer.

SUMMARY OF THE INVENTION

Accordingly, it is an object of this invention to provide an improved process for precisely locating and shaping holes in semiconductor material.

It is a further object of this invention to form an improved process for forming a hole through monocrystalline silicon material wherein the hole has substantially vertical sides.

In accordance with the invention, masking layers are formed on opposite sides of the silicon wafer, opposite registered openings formed in the masking layers, an impurity introduced through the openings into the wafer forming low resistivity regions, depositing a conductor contact on one side of the wafer in contact with the wafer, anodically etching the body through the openings from the opposite side until a region of porous silicon is formed completely through the wafer, and removing the resultant porous semiconductor material with an etchant for semiconductor material. A preferred process embodiment includes the thermal oxidation of the inner surface of the resultant hole, which provides an insulating layer within the opening.

The foregoing and other objects, features and advantages of the invention will be apparent from the following more particular description of preferred embodiments of the invention as illustrated in the accompanying drawings.

DESCRIPTION OF THE PREFERRED EMBODIMENTS

Figure 1:
FIGS. 1–6 is a sequence of elevational views in broken section of a silicon body which illustrate the method steps of preferred specific embodiments of the invention.
Figure 2:
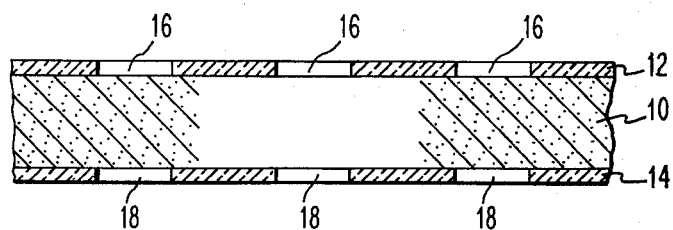

Referring now to the drawings, FIGS. 1–6, there is depicted in FIG. 1 the structure of the device at the first stage of the process. A monocrystalline silicon semiconductor body 10 having a major face or surface in the <100>plane is thermally oxidized to form layers 12 and 14 on opposite sides thereof. Layers 12 and 14 can be formed by exposing the wafer 10 to a steam atmosphere at an elevated temperature, as is well known in the art. Alternately, layers 12 and 14 can be other suitable layers as for example $Si_3N_4$, silicon oxynitride, or a composite layer such as $Si_3N_4$ over $SiO_2$. Layer 12 can also consist of a layer of chromium on a layer of $SiO_2$ and/or $Si_3N_4$. The body 10 is illustrated without including active and passive devices and isolation structure fabricated therein. However, it is understood that such structures can be fabricated in the silicon body prior to forming holes by this process, either on one or both sides of body 10. The thickness of body 10 can be of any suitable thickness, which thickness is ordinarily in the range of 4 to 15 mils, or 100 to 375 microns. As illustrated in FIG. 2, openings 16 and 18 are formed in layers 12 and 14, respectively, by conventional photolithographic and subtractive etching techniques. Openings 16 and 18 are placed in opposing registration. A preferred technique for achieving the registration of openings 16 and 18 in masking layers 12 and 14 is to form the openings in the masking layer on one side of the body 10 and subsequently align the mask for forming the openings in the layer on the opposite side using infrared light and appropriate alignment equipment. The resist is subsequently exposed through the aligned mask, using ultraviolet light.

Figure 3:
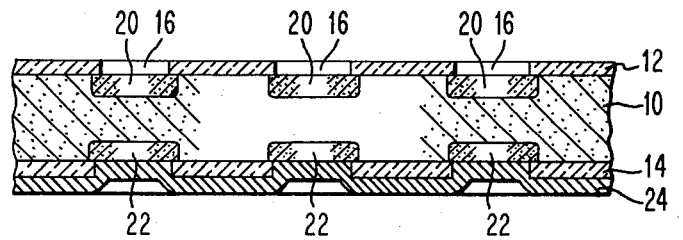
Figure 4:
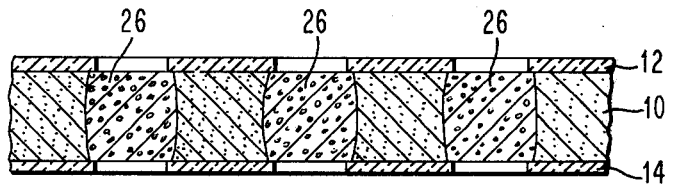

As illustrated in FIG. 3, an impurity is then introduced into body 10 through the openings 16 and 18. The resultant introduction of an impurity through the mask openings result in diffused regions 20 and 22. The impurity can be introduced by any suitable technique, as for example, diffusion or ion implantation. In the structure illustrated in FIG. 3, a P-type impurity is introduced into an N-type semiconductor body 10. However, other variations are possible. An N-type impurity can be introduced into an N-type semiconductor body in a concentration greater than the background immpurity. Alternately, an N-type impurity can be introduced into a P-type semiconductor or a P+ region formed in a P—type wafer. The diffusions 20 and 22 can be of any suitable depth from the surface. In general, these diffused regions need only penetrate the surface of the body a distance of one to 10 microns. A layer of metal 24 is then deposited on one side of body 10 over layer 14 and into contact with the silicon body 10 through openings 18 as shown in FIG. 3. The metal layer can be of any suitable type metal that will not erode away in the subsequent anodization step. A preferred metal is a layer of chromium. The body 10 is then placed into an electrolyte solution and made the anode thereof. Anodization in the appropriate solution results in the formation of porous silicon regions 26 in body 10 between openings 16 and 18, as shown in FIG. 4. The concept of producing porous silicon regions in monocrystalline semiconductor material is disclosed in U.S. Pat. No. 3,640,806. A preferred anodizing solution consists of one part of 49% HF and two parts of de-ionized water. A current of 10 milliamps per square centimeter of exposed area of the semiconductor body through openings 16 is used.

A variation of the aforementioned process consists of ion implanting helium or protons into both surfaces of an N-type body 10 through the openings in the mask and depositing the metal layer 24 on the opposite side. A second variation of the aforementioned process consists of diffusing or implanting into only one side of the wafer. A third variation is to perform the anodization in a wafer with no diffused or implanted regions 20 and 22.

Figure 5:
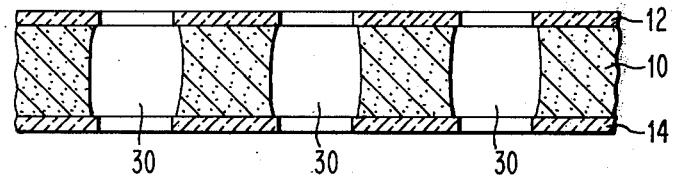
Figure 6:
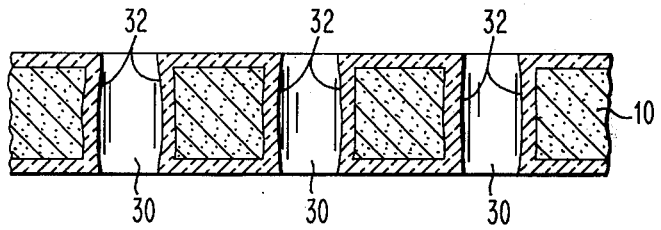

After the anodization of body 10 is completed, which results in porous silicon regions 26 that have substantially vertical sides, the layer 24 of metal is removed and the porous silicon regions 26 removed with a suitable silicon etchant. Porous silicon etches very rapidly and can be removed without significantly affecting the monocrystalline silicon material of body 10. This structure is shown in FIG. 5 wherein openings 30 with substantially vertical sides, are produced in body 10. As illustrated in FIG. 6, the interior surface of openings 30 can be oxidized by forming a layer 32 of $SiO_2$. This oxide layer provides an electrical isolation for any structure that is subsequently placed in holes 30 as for example conductive material to form conductive feed throughs.

With the aforedescribed method, holes with substantially vertical sides can be formed in monocrystalline silicon. The holes can be made of any suitable cross-sectional dimension which dimension can be equal to or greater than 1 micron. The resultant structure has a number of uses in the industry. For example, the process can be utilized to produce a filter where the hole size is controlled by the size of the window in the masking layer and by the amount of $SiO_2$ grown in the hole. Another potential use is an acoustical delay line where the unfilled openings in the semiconductor can be used to reflect sound waves. The holes can be filled with metal or other conductive material forming a very low resistance connection between the front and back of a wafer. This connection can be used for power distribution or interconnection between the devices made on both sides of the wafer or as feed throughs in a monocrystalline silicon chip carrier. Unfilled holes could be used as part of the ink jet nozzle array. Additionally, the holes could be filled with a magnetic material and used in a magnetic sensing element.

While the invention has been particularly shown and described with reference to the preferred embodiments thereof, it will be understood by those skilled in the art that the foregoing and other changes in form and detail may be made therein without departing from the spirit and scope of the invention.

What is claimed is:
1. A process for forming a hole through a monocrystalline silicon body comprising:
    forming masking layers on opposite sides of said body,
    forming opposite registering openings in said masking layers,
    introducing an impurity through said openings into said body forming low resistivity regions,
    depositing a conductive layer on one side of said body,
    anodically etching said body through the opening on the opposite side under conditions that form a region of porous silicon that extends completely through said body, and
    removing the resultant porous region with a silicon etchant.
2. The process of claim 1 wherein the surface of the resultant hole is oxidized forming an insulating layer of $SiO_2$.
3. The process of claim 2 wherein impurities are introduced into said body through said registered openings from both sides of said body.
4. The process of claim 1 wherein said impurity is introduced by ion implantation or diffusion.
5. The process of claim 4 wherein said impurity is introduced into said body from only one side.
6. The process of claim 1 wherein said conductive layer is a layer of chromium.
7. The process of claim 1 wherein said impurity is introduced into said body to a depth in the range of one to 10 microns.
8. The process of claim 8 wherein said body has a thickness in the range of 100 to 375 microns.
9. The process of claim 1 wherein said body has an N-type background impurity and said introduced impurity is a P-type.
10. The process of claim 1 wherein said body has an N-type background impurity and the introduced impurity is an N-type.
11. The process of claim 1 wherein said body has a P-type background impurity and said introduced impurity is an N-type.
12. The process of claim 1 wherein said body has a P-type background impurity and said introduced impurity is a P-type impurity.
13. The process of claim 1 wherein said impurity is protons or helium implanted into an N-type body.
14. The process of claim 1 wherein said masking layers are formed by thermally oxidizing the top and bottom surfaces of said body.
15. The process of claim 1 wherein said masking layers are formed of $Si_3N_4$.
16. The process of claim 1 wherein the masking layer exposed to the anodizing solution is a layer of chromium on top of $SiO_2$ and/or $Si_3N_4$.

* * * * *